United States Patent
Reboud et al.

(10) Patent No.: US 10,411,434 B2
(45) Date of Patent: Sep. 10, 2019

(54) SEMICONDUCTOR STRUCTURE COMPRISING A TENSILELY STRESSED SUSPENDED MEMBRANE INCLUDING AN OPTICAL CAVITY

(71) Applicant: Commissariat a l'energie atomique et aux energies alternatives, Paris (FR)

(72) Inventors: Vincent Reboud, Paris (FR); Salim Boutami, Grenoble (FR)

(73) Assignee: Commissariat A L'Energie Atomique et aux Energies Alternatives, Paris (FR)

( * ) Notice: Subject to any disclaimer, the term of this patent is extended or adjusted under 35 U.S.C. 154(b) by 0 days.

(21) Appl. No.: 16/110,157

(22) Filed: Aug. 23, 2018

(65) Prior Publication Data

US 2019/0067904 A1 Feb. 28, 2019

(30) Foreign Application Priority Data

Aug. 23, 2017 (FR) ...................... 17 57815

(51) Int. Cl.
| | |
|---|---|
| H01S 5/065 | (2006.01) |
| H01S 5/125 | (2006.01) |
| H01S 5/026 | (2006.01) |
| G02B 6/10 | (2006.01) |
| G02B 6/122 | (2006.01) |
| G02B 6/12 | (2006.01) |

(52) U.S. Cl.
CPC ............ H01S 5/0651 (2013.01); G02B 6/107 (2013.01); G02B 6/122 (2013.01); G02B 6/1228 (2013.01); H01S 5/026 (2013.01); H01S 5/125 (2013.01); *G02B 2006/12104* (2013.01); *G02B 2006/12121* (2013.01)

(58) Field of Classification Search
CPC ........... G02B 2006/12121; H01S 5/125; H01S 5/0651
USPC ......................................... 372/50.1; 250/349
See application file for complete search history.

(56) References Cited

U.S. PATENT DOCUMENTS

| | | | |
|---|---|---|---|
| 6,711,200 B1 * | 3/2004 | Scherer ................. | B82Y 20/00 372/19 |
| 2017/0093130 A1 * | 3/2017 | Gassenq ............... | H01S 5/3223 |
| 2017/0093131 A1 * | 3/2017 | Harada ............... | H01S 5/32341 |

OTHER PUBLICATIONS

A. Gassenq, et al., "Distributed Bragg Reflectors integration in highly strained Ge micro-bridges on 200 mm GeOI substrates for laser applications," 2015 IEEE 12 International Conference on Group IV Photonics (GFP), pp. 51-52 (Year: 2015).*

(Continued)

*Primary Examiner* — Tuan N Nguyen
(74) *Attorney, Agent, or Firm* — Oblon, McClelland, Maier & Neustadt, L.L.P.

(57) ABSTRACT

The invention relates to a semiconductor structure, including:
a semiconductor layer, including a membrane suspended above a carrier layer, the suspended membrane being formed of a central section, which is tensilely stressed and of a plurality of tensioning arms; and
least one optical cavity, bounded by two optical reflectors, which are placed in the lateral sections on either side of the central section;
wherein:
the central section is designed to transmit in the direction of the optical reflectors at least one uneven-order mode; and
each of said optical reflectors is formed of two lateral half-reflectors, which are arranged on either side of a longitudinal axis of the lateral section, so as to at least partially reflect said uneven-order mode.

12 Claims, 5 Drawing Sheets

(56) References Cited

OTHER PUBLICATIONS

Jan Petykiewicz, et al., "Direct Bandgap Light Emission from Strained Germanium Nanowires Coupled with High-Q Nanophotonic Cavities," American Chemical Society, Nano Letters, 2016, pp. 2168 - 2173 (Year: 2016).*

French Preliminary Search Report dated Jun. 12, 2018 in French Application 17 57815 filed on Aug. 23, 2017 (with English Translation of Categories of Cited Documents and Written Opinion).

Jan Petykiewicz, et al., "Direct Bandgap Light Emission from Strained Germanium Nanowires Coupled with High-Q Nanophotonic Cavities," American Chemical Society, Nano Letters, 2016, pp. 2168-2173.

A. Gassenq, et al., "Distributed Bragg Reflectors integration in highly strained Ge micro-bridges on 200 mm GeOI substrates for laser applications," 2015 IEEE 12$^{th}$ International Conference on Group IV Photonics (GFP), pp. 51-52.

A. Gassenq, et al., "1.9% bi-axial tensile strain in thick germanium suspended membranes fabricated in optical germanium-on-insulator substrates for laser applications," Applied Physics Letters, vol. 107, No. 19, Nov. 2015, pp. 191904-1-191904-4.

Jan Petykiewicz, et al., "Direct Bandgap Light Emission from Strained Ge Nanowires Coupled with High-Q Optical Cavities," Physics Optics, 2015, 17 Pages.

M. J. Suess, et al., "Analysis of enhanced light emission from highly strained germanium microbridges," Nature Photonics, vol. 7, Jun. 2013, pp. 466-472.

Thomas Zabel, et al., "Top-down method to introduce ultra-high elastic strain," Materials Research, vol. 32, No. 4, 2017, pp. 726-736.

* cited by examiner

SEMICONDUCTOR STRUCTURE COMPRISING A TENSILELY STRESSED SUSPENDED MEMBRANE INCLUDING AN OPTICAL CAVITY

TECHNICAL FIELD

The field of the invention is that of semiconductor structures made of a crystalline semiconductor compound, including a membrane a central section of which is suspended and tensilely stressed by tensioning arms, and an optical cavity. The invention in particular applies to optoelectronic devices including such a semiconductor structure, such as, for example, laser sources.

PRIOR ART

In various optoelectronic or microelectronic applications, it may be advantageous to use a layer made of a crystalline, and preferably single-crystal, semiconductor compound having a tensile mechanical stress. This is in particular the case of certain light sources the material of the emissive layer of which has, when stress-free, an indirect energy band structure, the band structure then being made direct by applying a sufficient tensile stress. The crystalline semiconductor compound may be a germanium-based compound, for example germanium, germanium tin, or even silicon germanium.

The article by Petykiewicz et al. entitled *Direct Bandgap Light Emission from Strained Ge Nanowires*, Nano Lett., 2016, 16 (4), 2168-2173, describes an example of a semiconductor structure including a germanium-based semiconductor layer, the semiconductor layer being structured to form a membrane suspended above a carrier layer. The suspended membrane includes a central section that is tensilely stressed by lateral sections forming tensioning arms. The central section forms the gain medium of a laser source, the latter being located in an optical cavity defined by two Bragg mirrors. The Bragg mirrors are placed in the tensioning arms, and are formed by a periodic succession of localized etches of the semiconductor layer.

There is however a need to provide such a semiconductor structure the mechanical properties of the suspended membrane of which are preserved or even improved following the production of the optical cavity. There is also a need to provide such a semiconductor structure the optical and/or electronic properties of the suspended membrane of which are preserved or even improved.

SUMMARY OF THE INVENTION

The objective of the invention is to at least partially remedy the drawbacks of the prior art, and more particularly to provide a semiconductor structure including a suspended membrane made from a crystalline semiconductor compound the mechanical properties of the suspended membrane of which are preserved or even improved after production of the optical cavity, thereby allowing its optical and/or electronic properties to be preserved or even improved.

To this end, one subject of the invention is a semiconductor structure including:
a semiconductor layer made of a crystalline semiconductor compound, including a membrane suspended above a carrier layer, the suspended membrane being formed:
of a central section, which is tensilely stressed in a plane parallel to the carrier layer, and which forms a waveguide able to support at least one optical mode; and of a plurality of lateral sections, which are opposite one another with respect to the central section, and which are arranged so as to keep the central section suspended and tensilely stressed, the lateral sections having an average width larger than an average width of the central section; and
at least one optical cavity, bounded by two optical reflectors, which are placed in the lateral sections on either side of the central section.

According to the invention, the central section is designed to transmit in the direction of the optical reflectors at least one uneven-order mode. In addition, each of said optical reflectors is formed of two lateral half-reflectors, which are separate from one another and arranged on either side of a longitudinal axis of the lateral section in which they are placed, so as to at least partially reflect said uneven-order mode.

The following are certain preferred but nonlimiting aspects of this semiconductor structure.

The lateral half-reflectors may each have a main separating angle defined between, on the one hand, a median axis passing through a centre of the lateral half-reflector and through an end of the central section located facing the corresponding lateral half-reflector and, on the other hand, the longitudinal axis of the lateral section.

The main separating angle may be larger than 25°.

The central section may have a local width, at its ends, larger than an average width of the central section, and designed so that the uneven-order mode has a median scattering angle in the direction of the lateral half-reflectors substantially equal to the main separating angle.

The central section may have a local width, at its ends, larger than or equal to 0.8 µm. In addition, the lateral half-reflectors may each have a main separating angle larger than or equal to 40°.

The uneven-order mode may be the first-order mode (TE01; TM01).

The central section may be designed to transmit, in the direction of the optical reflectors, at most the fundamental mode and the first-order mode.

The central section may be multimode over its entire length and may have at least one transverse dimension such that it permits the transmission of the fundamental mode and at most the first-order mode.

The central section may include a monomode portion designed to support the fundamental mode and, placed between the lateral sections and the monomode portion, mode converters that are designed to convert the fundamental mode into the uneven-order mode.

The crystalline semiconductor compound is preferably a germanium-based compound.

The central section preferably has an average tensile strain such that its energy band structure is direct.

The invention also relates to a laser source including a semiconductor structure according to any one of the preceding claims, wherein the central section forms the gain medium of the laser source.

BRIEF DESCRIPTION OF THE DRAWINGS

Other aspects, aims, advantages and features of the invention will become more clearly apparent on reading the following detailed description of preferred embodiments thereof, this description being given by way of nonlimiting example and with reference to the appended drawings, in which:

FIG. 2C illustrates the influence of the main separating angle $\theta_p$ on:

Figure 3:
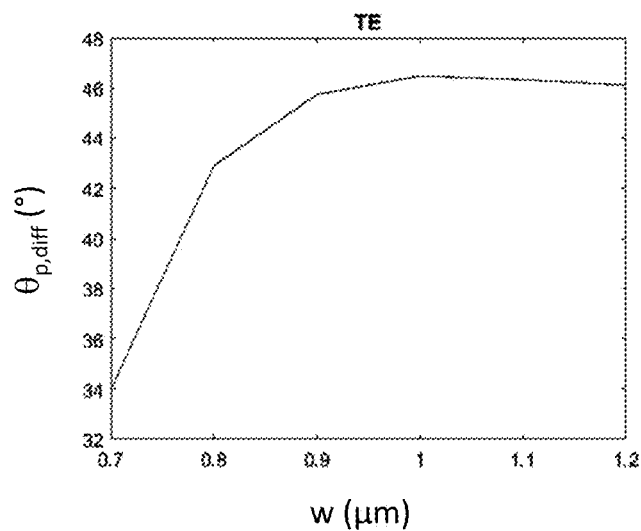
Figure 3:
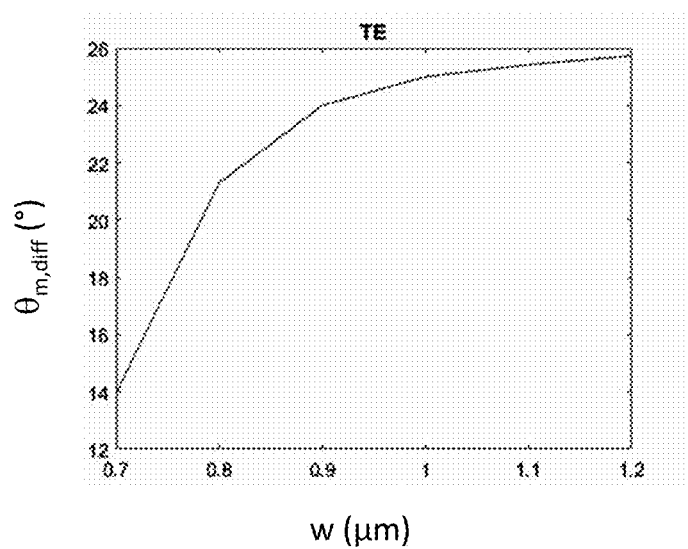
Figure 4A:
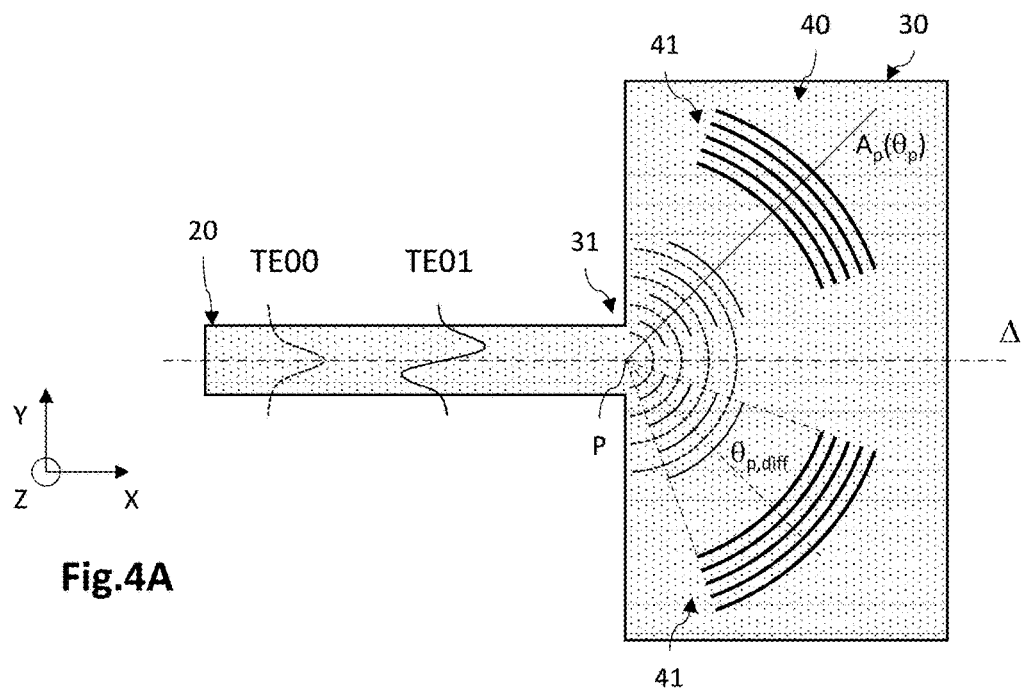
Figure 4B:
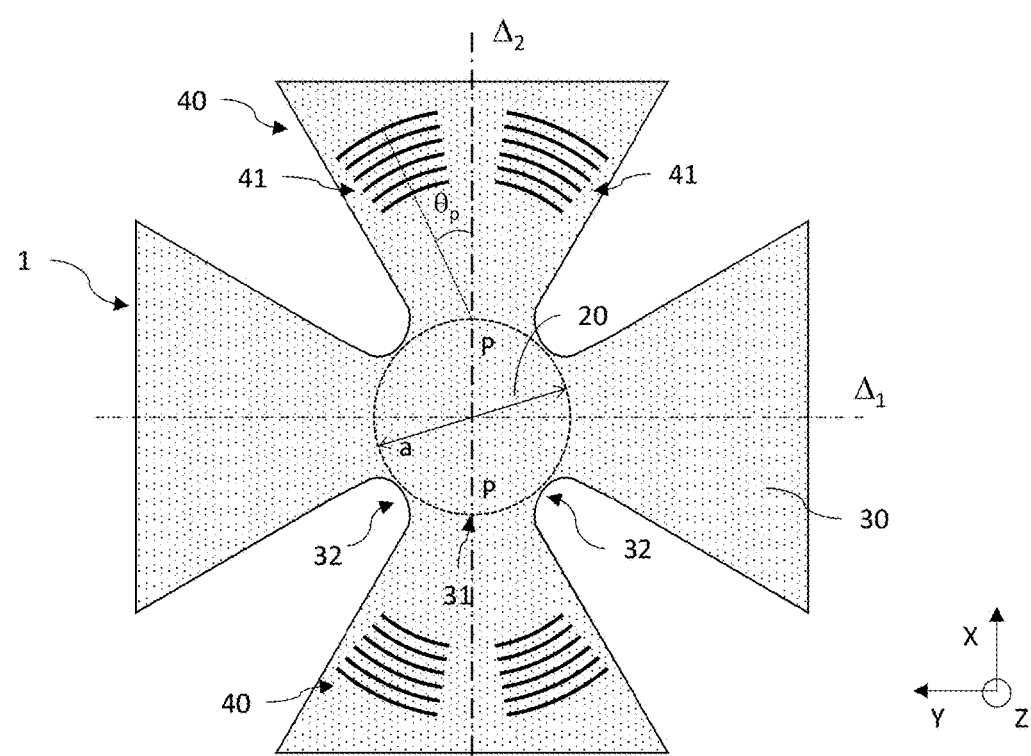
Figure 5A:
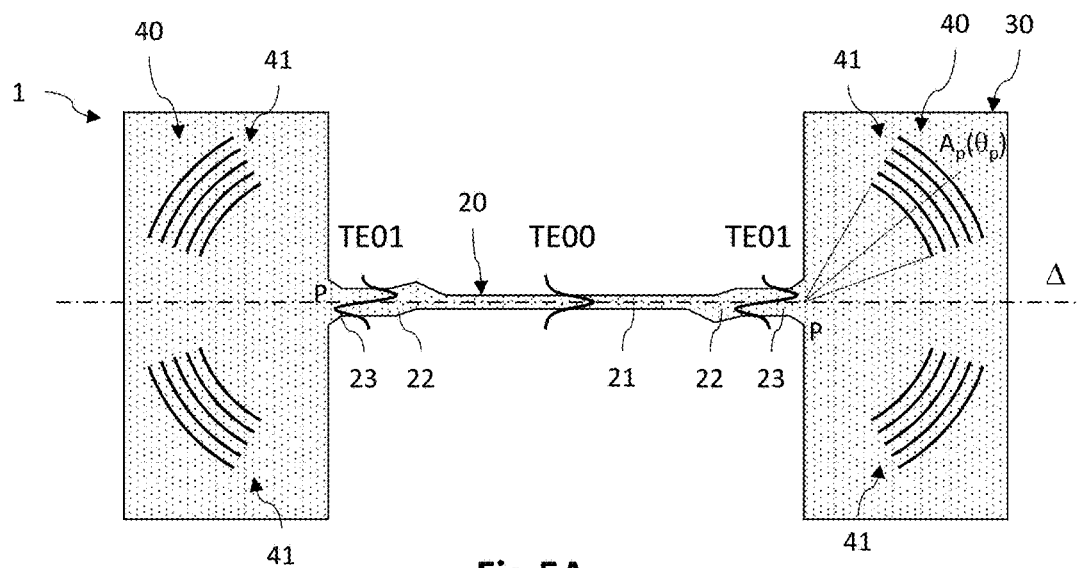
Figure 5B:
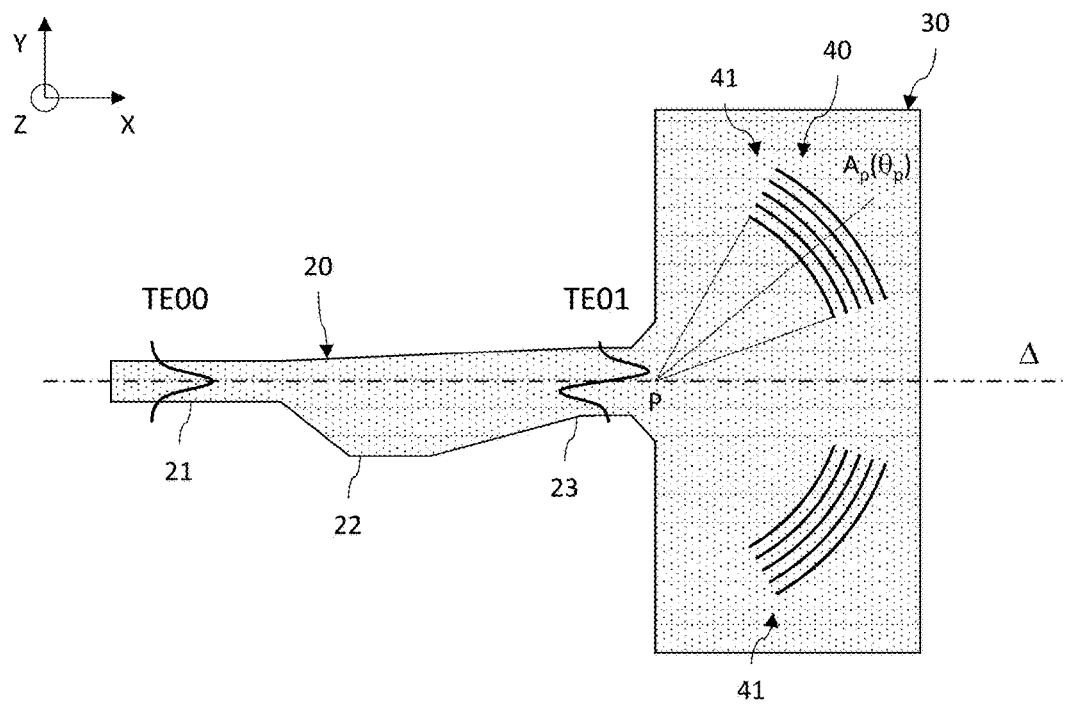

the strain differential $\Delta\varepsilon_c$ at the centre of the central section with and without the optical cavity;

the maximum local value $(\varepsilon_{xy})$max of the strain experienced by a tensioning arm in the presence of the optical cavity; and the maximum strain amplitude $(\Delta\varepsilon)_{max}$ experienced by a tensioning arm in the presence of the optical cavity;

FIG. 3 illustrates the influence of the local width w of the central portion at its ends P on the median angle $\theta_{p,diff}$ and minimum angle $\theta_{m,diff}$ of the scattering of the TE01 optical mode in the direction of the lateral half-reflectors;

FIGS. 4A and 4B are schematic and partial top views of two different examples of a semiconductor structure according to one embodiment, in which embodiment the central section is multimode and designed to support, over its entire length, the fundamental mode and at least one higher uneven-order mode, the central section being tensilely stressed uniaxially (FIG. 4A) and biaxially (FIG. 4B); and FIGS. 5A and 5B are schematic and partial top views of an example of a semiconductor structure according to another embodiment, in which embodiment the central section is structured to have a monomode main portion and two mode-converting end portions located between the monomode portion and the tensioning arms, FIG. 5B being a detailed view of a portion of the suspended membrane illustrated in FIG. 5A.

DETAILED DESCRIPTION OF PARTICULAR EMBODIMENTS

In the figures and in the rest of the description, the same references will be used to refer to elements that are identical or similar. In addition, the various elements are not shown to scale for the sake of clarity of the figures. Moreover, the various embodiments and variants are not exclusive from one another and may be combined together. Unless otherwise indicated, the terms "substantially", "about" and "of the order of" mean to within 10%.

The invention generally relates to a semiconductor structure including a suspended membrane made of a crystalline semiconductor compound, the membrane including a suspended central section that is tensilely stressed by lateral sections forming tensioning arms. The suspended membrane is preferably based on germanium that is sufficiently tensilely strained for the central section to have, at least partially, a direct energy band structure. The central section forms a waveguide placed in an optical cavity, the latter being bounded by optical reflectors placed in the tensioning arms. In one preferred application of the semiconductor structure, the central section forms the gain medium of a laser source.

Generally, the crystalline semiconductor compound is preferably single-crystal, and may in particular be chosen from elements of column IV of the periodic table of the elements, such as silicon, germanium, tin in its semiconductor phase, and alloys formed from these elements, for example SiGe, GeSn, SiGeSn, etc. It may also be chosen from alloys including elements from columns III and V of the periodic table of the elements, for example GaInAs and InP, or even including elements from columns II and VI, for example CdHgTe. Preferably, the crystalline semiconductor compound has, in the absence of tensile strain within its crystal lattice, an indirect energy band structure. Its band structure is substantially direct when it undergoes a sufficient tensile strain. It is preferably germanium or a germanium-based alloy.

By stressed section, what is meant is a layer section made from a crystalline semiconductor compound having a tensile or compressive mechanical stress leading to a strain of the unit cells of its crystal lattice. The section is tensilely stressed when it experiences a mechanical stress that tends to stretch the unit cells of the lattice in a plane. In the context of the invention, the central section of the suspended membrane is tensilely stressed in the plane of the semiconductor layer, this meaning that its lattice parameter has what is called an effective value higher than its natural value when the semiconductor compound is relaxed (i.e. unstressed). In the rest of the description, unless otherwise indicated, the stress in question is oriented in the plane of the semiconductor layer.

By direct or substantially direct band structure, what is meant is that the minimum energy $E_{CB,L}$ of the conduction band of the L valley (or indirect valley) is higher or substantially equal to the energy minimum $E_{CB,\Gamma}$ of the conduction band of the $\Gamma$ valley (or direct valley), in other words: $\Delta\varepsilon = E_{CB,L} - E_{CB,\Gamma} \geq 0$ By substantially equal, what is meant here is that this energy difference is of the same order of magnitude or smaller than kT, where k is Boltzmann's constant and T the temperature of the material. Preferably, the semiconductor layer is based on germanium the energy band structure of which is indirect outside of the central section of the suspended membrane, in other words $\Delta E < 0$, and the central section has a sufficient tensile strain to make its energy band structure at least partially direct.

Figure 1A:
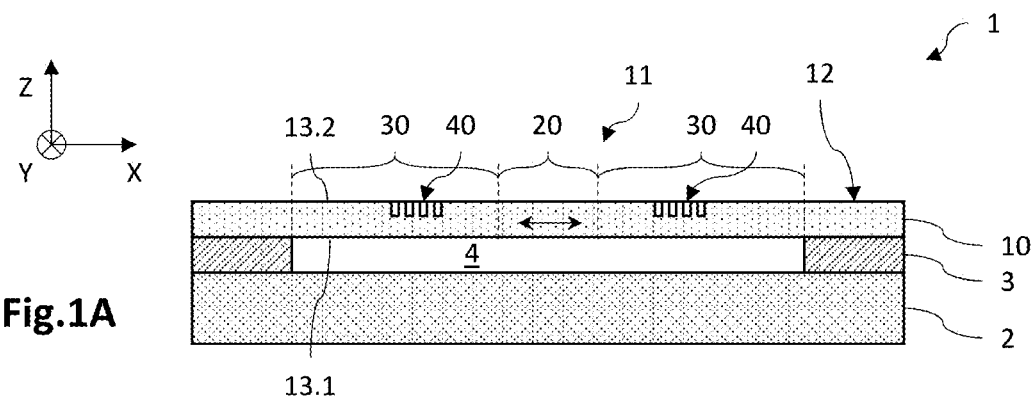
FIG. 1A is a schematic partial longitudinal cross-sectional view of a semiconductor structure according to an example of the prior art, including a suspended membrane with a central section that is tensilely stressed uniaxially by tensioning arms, and an optical cavity.
Figure 1B:
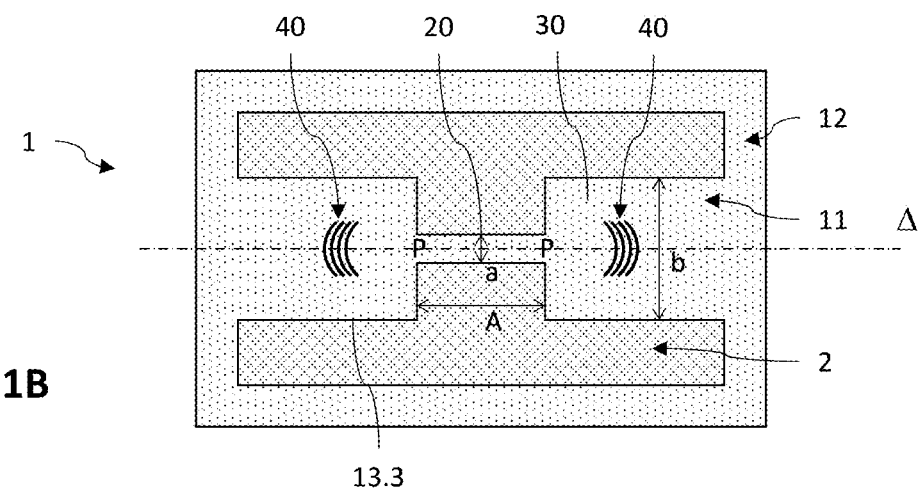
FIG. 1B is a schematic top view of the semiconductor structure illustrated in FIG. 1A.

FIGS. 1A and 1B are a partial schematic longitudinal cross-sectional view (FIG. 1A) and a partial schematic top view (FIG. 1B), of a semiconductor structure 1 comprising a suspended membrane including an optical cavity according to an example of the prior art.

Here and for the rest of the description, a three-dimensional direct coordinate system (X, Y, Z) is defined, in which the X and Y axes form a plane parallel to the plane of a carrier layer 2, and in which the Z-axis is oriented in the direction of the thickness of the layers. In the rest of the description, the terms "lower" and "upper" will be understood to mean relating to a position that increases with distance from the carrier layer 2 along the +Z-direction.

The semiconductor structure 1 includes a stack formed of a carrier layer 2, of a sacrificial layer 3 and of a semiconductor layer 10 made of a preferably single-crystal crystalline semiconductor compound. The carrier layer 2 may be made of a material chosen from silicon, sapphire, borosilicate, silica, glass, quartz or any other suitable material. The sacrificial layer 3 may be made of a material chosen from an oxide or nitride of silicon, inter alia. The semiconductor layer 10 is preferably germanium-based. The sacrificial layer 3 may have a thickness of the order of a few tens of nanometres to a few microns. The carrier layer 2 may have a thickness of a few tens of nanometres to a few hundred microns.

Figure 1C:
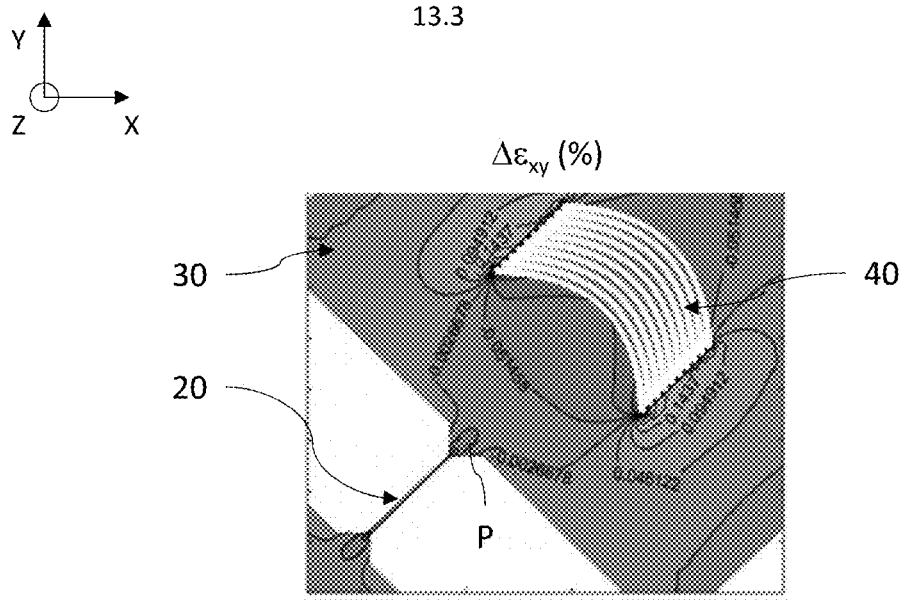
FIG. 1C illustrates a distribution of the mechanical-stress field experienced by one of the tensioning arms shown in FIG. 1B, showing the presence of zones of concentration of stresses in proximity to the optical reflector.

The semiconductor layer 10 is formed of a structured portion 11 that is suspended above the carrier layer 2 and of a peripheral portion 12 that encircles the structured portion 11. The peripheral portion 12 rests on the sacrificial layer 3, the latter forming a cavity 4 located under the structured portion ii. The structured portion 11 includes a central section 20 connected to the peripheral portion 12 by lateral sections 30 forming tensioning arms 30. As FIGS. 1B and 1C show, the central section 20 may have a shape, in the (X, Y) plane, that is substantially square or rectangular, of a few hundred nanometres to a few microns in width, or even a polygonal or circular shape in the case of a biaxial strain. The semiconductor layer 10 may have, depending on the targeted optoelectronic or electronic applications, a thickness of the order of a few tens of nanometres to a few microns, or even more. In the structured portion 11, the suspended membrane has a lower face 13.1 that is oriented toward the carrier layer 2 and an opposite upper face 13.2, and lateral flanks 13.3 connecting the lower face 13.1 and upper face 13.2 to each other.

At least two lateral sections 30 are produced that each connect a border of the central section 20 to the peripheral portion 12. They are arranged pairwise with respect to the central section 20 so as to define at least one substantially rectilinear strain axis Δ. In the example of FIG. 1B, a pair of lateral sections 30 are shown, the latter each extending from a border of the central section 20 as far as to the peripheral portion 12. The two lateral sections 30 are arranged so as to define a single strain axis Δ, here parallel to the X-axis. Thus, the central section 20 experiences a uniaxial tensile strain along the strain axis Δ. This strain axis Δ coincides with the longitudinal axis of the lateral sections 30.

The central section 20 is a tensilely stressed section, i.e. its crystal lattice is strained, increasing its natural lattice parameter. The lateral sections 30 allow the initial tensile stress value in the central section 20 to be increased, preferably without however themselves experiencing a significant mechanical stress. They thus form tensioning arms 30. To this end, the tensioning arms 30 and the central section 20 are dimensioned so that the average width "b" of the tensioning arms 30 is larger than the average width "a" of the central section 20, and preferably ten times larger than the latter. By width, what is meant is the local dimension between the opposite lateral flanks 13.3 of a section or of an arm, in the XY-plane. Thickness is the local dimension between the lower face 13.1 and upper face 13.2 along the Z-axis. The central section 20 has a longitudinal length dimension, here oriented along the X-axis, which coincides with the strain axis Δ, and transverse dimensions of width along the Y-axis and of thickness along the Z-axis.

The central section 20 forms a waveguide, which may be monomode or multimode, and which is designed to support a resonant optical signal moving through the optical cavity. It thus forms the high-refractive-index core of the waveguide, which is surrounded by a vacuum, a fluid, or even an encapsulating material that forms a low-refractive-index cladding. By way of example, the waveguide 20 may be dimensioned so that the guided optical signal is essentially polarized in TE (transverse electric) mode, i.e. so that it has a polarization plane that is substantially parallel to the plane of the guide. To this end, the latter has a width larger than its thickness. The waveguide 20 may, as a variant, be dimensioned so that its thickness is larger than its width, this implying that the optical signal is essentially polarized in TM (transverse magnetic) mode. It may support both a TE mode and a TM mode when its transverse dimensions of width and thickness are of the same order of magnitude as or are large with respect to the wavelength. By way of example, for an emission wavelength of the laser source of 1.31 μm (for what are called datacom applications) or 1.55 μm (for what are called telecom applications), the width and thickness of the central section may be a few hundred nanometres to a few microns, and for example equal to about 600 nm. In the case of a laser source the gain medium of which is a central germanium-based section, the emission wavelength may be longer than or equal to 1.6 μm and for example comprised between 2 and 5 μm.

The areal dimension in the XY-plane, and in particular the width of each tensioning arm 30, may be chosen so that the tensioning arms 30 have a negligible strain with respect to the strain experienced by the central section 20. More precisely, the average local strain decreases with distance from the stressed section 20. In the example of FIG. 1B, the lateral sections 30 are rectangle shape, but other shapes are possible, for example a trapezium shape the width of which increases continually with distance from the central section 20.

The suspended membrane may have been structured so as to control the value of the amplification of the tensile stress of the central section 20, i.e. of the amplification obtained during the production of the cavity 4 and therefore during the suspension of the membrane. To this end, the dimensional parameters of the structured portion ii, for example the widths and lengths of the central section 20 and of the tensioning arms 30, are determined beforehand. By way of example, in the case of a rectangular central section 20 of length A and of constant average width a, and of rectangular tensioning arms 30 of length B/2-A/2 and of constant width b, an amplification factor f relating the final tensile stress σ$^f$ of the central section 20 to the initial tensile stress σ$^i$ may be expressed by the following relationship, formulated in the article by Süess et al. entitled *Analysis of enhanced light emission from highly strained germanium microbridges*, Nature Photon. 7, 466-472 (2013):

$$f = \frac{2L+B}{B}\left(1 + \frac{A}{B-A}\right) \Big/ \left(\frac{a}{b} + \frac{A}{B-A}\right)$$

where L is the length of the suspended structured portion 11. Thus, depending on the dimensional parameters of the structured portion 11 of the semiconductor layer 10, it is possible to control the value of the amplification of the tensile stress applied to the central section 20 during the production of the cavity 4. The amplification factor may also be estimated by means of a numerical simulation software package such as COMSOL Multiphysics.

The semiconductor structure includes an optical cavity defined by two optical reflectors 40 that are optically associated with one another and placed in the tensioning arms 30. The optical axis of the cavity here coincides with the longitudinal strain axis Δ of the tensioning arms 30, and with the longitudinal axis of the central section 20. The optical cavity forms a resonant segment that is designed to set the wavelengths emitted by an electronically or optically pumped laser source, the gain medium of which will be formed by the central section. One of the optical reflectors 40 may be a total reflector having a reflectivity substantially equal to 100%, and the other optical reflector 40 may be a partial reflector so as to allow the directional emission of an optical signal at the wavelength of the Fabry-Pérot cavity. The partial optical reflector 40 then has a reflectivity lower than 100%, and for example equal to about 50%.

Each optical reflector 40 is thus placed in a tensioning arm 30, at a distance here of a few microns from an end P of the central section. The ends P of the central section 20 may be defined on the basis of the distribution of the mechanical stresses, and for example when the local value is lower than 50% of the average value of the mechanical stresses in the central section. They are here located at the junction 31 between the central section 20 and a tensioning arm 30. In this example, each optical reflector 40 is a distributed Bragg reflector (DBR) an example of which is illustrated in the aforementioned document Petykiewicz 2016. They are each formed of a plurality of circularly arcuate lines that are parallel to one another and formed by locally etching the layer of the tensioning arms 30.

FIG. 1C is a detailed view of an optical reflector 40 similar to one of those illustrated in FIG. 1B, and illustrates the presence of zones of concentration of mechanical stresses in the tensioning arms 30. More precisely, FIG. 1C shows the local strain differential $\Delta\varepsilon_{xy}$ experienced by the suspended membrane with and without optical cavity. This local strain differential $\Delta\varepsilon_{xy}$ is defined in the following way:

$$\Delta\varepsilon_c = [(\varepsilon_{xy})_{av} - (\varepsilon_{xy})_{ss}]/(\varepsilon_{xy})_{ss}$$

where $(\varepsilon_{xy})_{av}$ is the value of the local strain in the presence of the optical cavity and $(\varepsilon_{xy})_{ss}$ is the value of the local strain in the absence of the optical cavity for the same suspended membrane.

In this example, the semiconductor compound is germanium, and the suspended membrane has an average thickness of 600 nm. The central section 20 has a length of about 15 μm and a width of about 600 nm. It is thus monomode and supports both the fundamental TE mode and the fundamental TM (transverse magnetic) mode. The tensioning arms 30 have a width of about 55 μm. The central section 20 has an average tensile strain of about 5.2% allowing a direct energy band structure to be obtained. The optical reflectors 40 are each formed of a Bragg mirror placed at a distance of about 15 μm from the end P and are located on the longitudinal strain axis Δ.

It may be seen therefrom that zones of concentration of stresses are present in the tensioning arms 30 in proximity to the optical reflectors 40, and more precisely at the lateral borders of the optical reflectors 40. The zones of concentration are here identified as being zones of high values of the local strain differential $\Delta\varepsilon_{xy}$. In this example, a local differential value $\Delta\varepsilon_{xy}$ of about 0.55% is present on the lateral borders of the optical reflectors 40. These zones of concentration of stress, which are related to the production of the optical cavity in the tensioning arms 30, are accompanied by a degradation in the mechanical properties of the suspended membrane, and potentially a decrease in the mechanical strength of the tensioning arms 30, and therefore of the suspended membrane. This may lead to a degradation in the electronic and/or optical properties of the suspended membrane.

Moreover, as detailed below with reference to FIG. 2C, which in particular illustrates the influence of the position $\theta_p$ of the optical reflectors 40 with respect to the longitudinal axis Δ on the value of a tensile-strain field $\Delta\varepsilon_c$ experienced at the centre of the central section 20, it appears that the presence of the optical reflectors 40 in the tensioning arms 30, and more precisely their position $\theta_p$ with respect to the longitudinal axis Δ, decreases the value of the strain experienced at the centre of the central section 20. This decrease is maximal when the optical reflectors 40 are positioned on the longitudinal axis Δ ($\theta_p = 0°$). This introduces a bias in the desired mechanical properties of the suspended membrane and in particular of the central section 20. This bias is liable to be disadvantageous insofar as it leads to an unwanted modification of the electronic and/or optical properties of the suspended membrane. More precisely, because of this decrease, the strain experienced by the central section 20 is liable to be insufficient to make its energy band structure direct.

Figure 2A:
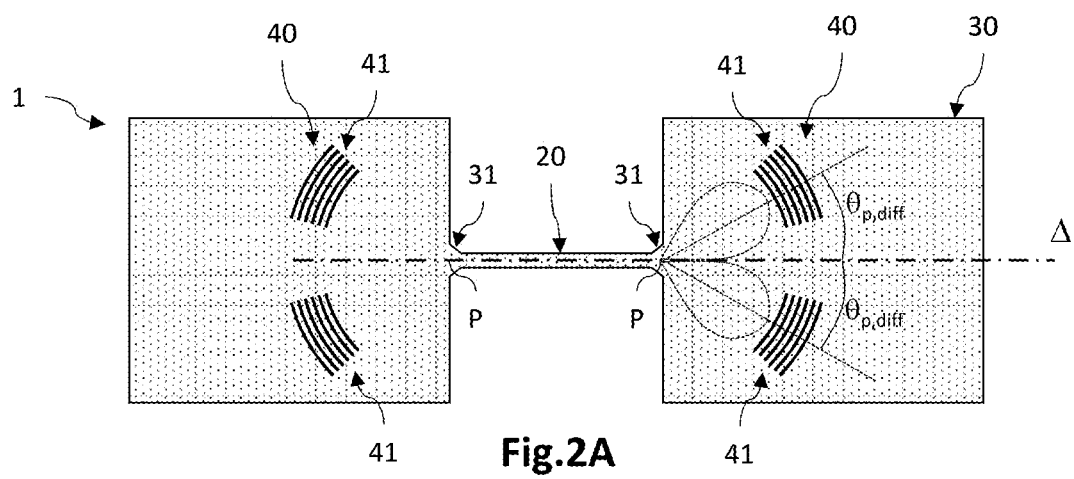
FIG. 2A is a schematic partial view of a semiconductor structure according to one embodiment, in which embodiment each optical reflector that bounds the optical cavity is formed of two lateral half-reflectors.
Figure 2B:
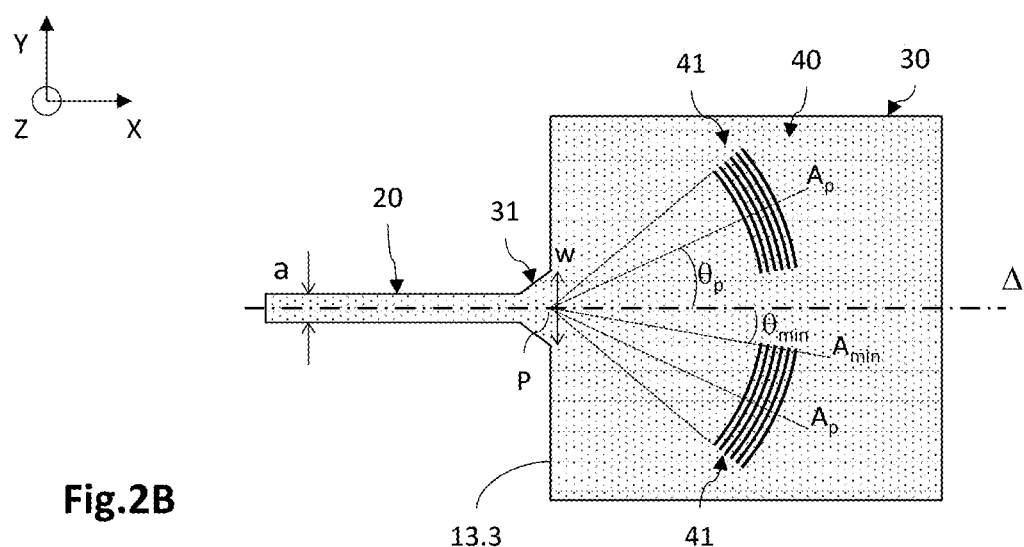
FIG. 2B is a detailed view of a portion of the suspended membrane illustrated in FIG. 2A.

FIG. 2A is a partial schematic view of a suspended membrane and optical cavity according to a first embodiment, in which figure each optical reflector 40 that bounds the optical cavity is formed of two lateral half-reflectors 41. FIG. 2B is a detailed view of one portion of the suspended membrane illustrated in FIG. 2A.

The central section 20 forms a waveguide for the optical signal propagating in the optical cavity. Said central section is designed to support, at least over some of its length, and to transmit in the direction of the lateral half-reflectors 41, at least one guided mode of order higher than the fundamental guided mode, and more precisely an uneven-order mode. To this end, the central section 20 is at least partially dimensioned and optionally structured to support said uneven-order optical mode.

In so far as the higher order mode is an uneven-order mode, it scatters in the direction of the lateral half-reflectors 41 anisotropically from the ends P of the central section 20. More precisely, the uneven-order mode scatters in a scattering cone that has a nonzero median scattering angle $\theta_{p,diff}$ with respect to the longitudinal axis Δ. In other words, the uneven-order mode scatters on either side of the longitudinal axis Δ in the direction of the lateral half-reflectors 41, along privileged scattering axes that each make the same nonzero angle $\theta_{p,diff}$ to the longitudinal axis Δ. In contrast, the fundamental mode, and higher order even modes, scatter isotropically so that these modes do not have a nonzero median scattering angle with respect to the longitudinal axis Δ. Preferably, the central section 20 is designed to support, apart from the fundamental mode, only the first-order uneven mode, and no other higher order modes. Thus, in the case where the central section 20 supports the fundamental mode TE00, it is designed to also support at most the TE01 mode, and not the other TE modes of higher order, for example TE02, TE03, but also TE11, etc. The uneven mode may be supported over the entire length of the central section 20 or over some of its length. The same goes for transverse magnetic (TM) modes: the central section 20 may be designed to also, or as a variant, support TM modes, namely the fundamental mode TM00 and preferably at most the uneven mode TM01.

The central section 20 includes at least one multimode zone in which it is designed to support the fundamental mode and at least, and preferably at most, the first-order uneven mode, for example here the TE00 and TE01 modes. In so far as the central section 20 is designed to transmit the uneven-order mode in the direction of the lateral half-reflectors 41, the one or more multimode zones are located between the ends P of the central section 20. Thus, as detailed below, according to a first embodiment, the central section 20 may be multimode over its entire length and thus support the fundamental and the uneven mode, for example the TE00 and TE01 modes. As a variant, according to a second embodiment, it may be monomode over most of its length and be designed to support the fundamental mode, for example the TE00 mode, and be multimode at its ends and designed to locally support the uneven-order mode, for example the TE01 mode.

The suspended membrane thus includes two main optical reflectors 40 that define the optical cavity, each reflector 40 being placed in a tensioning arm 30 at a substantially equal distance with respect to the central section 20. Each main reflector 40 is formed of a set of two lateral half-reflectors 41 that are arranged on either side of the longitudinal axis Δ of the tensioning arm in which they are placed. Each lateral half-reflector 41 is a structure that is reflective with respect to at least the uneven-order optical mode transmitted by the central section 20. Each lateral half-reflector has a partial or total reflectivity.

Each lateral half-reflector 41 is a structure produced by completely or partially etching the thickness of the tensioning arm 30 locally. Each lateral half-reflector here has a main separating axis $A_p$, which also forms an axis of symmetry of the lateral half-reflector 41. This separating axis $A_p$ passes through the corresponding end P of the central section 20 and the centre of the lateral half-reflector 41, for example its centroid. It defines a main separating angle $\theta_p$ with the longitudinal strain axis Δ. The end P of the central section 20 is here located at the junction 31 with the tensioning arm 30, and is positioned on the longitudinal axis Δ. In the case of tensioning arms 30 of substantially rectangular shape, as shown in FIG. 2B, the end P substantially coincides with the intersection between the longitudinal axis Δ and a plane parallel to the YZ-plane formed by the lateral flanks 13.3 of the tensioning arm 30. In the case (not shown) of tensioning arms 30 of trapezium shape, the end P of the central section 20 may correspond to the junction 31 with the tensioning arm 30 when the width increases with distance from the central section 20. Moreover, it is possible to define a minimum separating angle $\theta_{min}$ made between the longitudinal axis Δ and an axis $A_{min}$ passing through the end P in question and the tip of the lateral half-reflector 41 closest to the longitudinal axis Δ. By definition, in so far as the lateral half-reflectors 41 of a given tensioning arm 30 are separate from each other, the angles $\theta_{min}$ are nonzero.

The lateral half-reflectors 41 are placed at a nonzero distance from the central section 20, here defined between the end P in question and the tip of the closest lateral half-reflector 41, along the main separating axis $A_p$. This distance may be of the order of a few microns, for example comprised between 1 μm and 20 μm, and preferably comprised between about 5 μm and 10 μm. The two lateral half-reflectors 41 of a given tensioning arm 30 preferably have, with respect to each other, an axial symmetry, i.e. they have substantially identical dimensions and a relative position that is symmetric with respect to the longitudinal axis Δ. Furthermore, the separating angles $\theta_{min}$ and $\theta_p$ are preferably identical for the two lateral half-reflectors 41 of a given tensioning arm 30. In this example, the lateral half-reflectors 41 are Bragg mirrors, but it may also be a question of cube-corner structures as in particular described in the article by Zabel et al. entitled *Top-down method to introduce ultra-high elastic strain*, J. Mater. Res., 2017, 32 (4), 726-736.

Thus, the uneven-order guided mode supported by the central section 20, for example the TE01 mode, is transmitted in the tensioning arms 30 in the direction of the lateral half-reflectors 41 with a nonzero median scattering angle $\theta_{p,diff}$. Because of the lateral position of the lateral half-reflectors 41 on either side of the longitudinal axis Δ, a good reflectivity of the uneven-order mode is obtained, thus favouring, within the optical cavity, the uneven-order mode over the fundamental mode (when this mode is also transmitted in the direction of the optical reflectors 40). The quality factor of the optical cavity associated with the uneven mode is thus better than that associated with the fundamental mode.

Figure 2C:
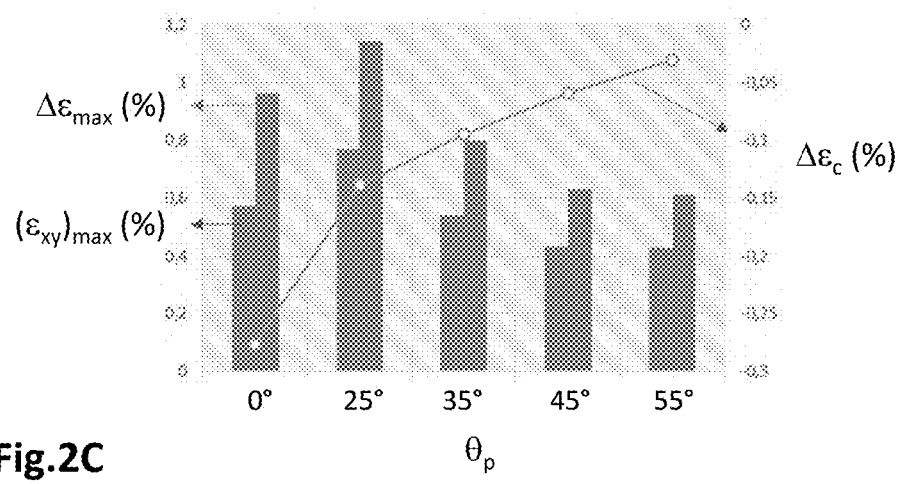

FIG. 2C illustrates the influence of the main separating angle $\theta_p$ on the strain differential $\Delta\varepsilon_c$ experienced at the centre of the central section 20, this strain differential being induced by the presence of the optical cavity. The strain differential $\Delta\varepsilon_c$ is here defined in the following way:

$$\Delta\varepsilon_c = [(\varepsilon_c)_{av} - (\varepsilon_c)_{ss}](\varepsilon_c)_{ss}$$

where $(\varepsilon_c)_{av}$ is the value of the strain experienced at the centre of the central section 20 in the presence of the optical cavity, and $(\varepsilon_c)_{ss}$ is the value of the strain experienced at the centre of the central section 20 in the absence of the optical cavity for the same suspended membrane.

In this example, the suspended membrane is made of germanium, and includes a central section 20 of about 600 nm thickness and width, and of about 15 μm length. The tensioning arms 30 have a rectangular shape of about 55 μm width for a thickness of about 600 nm. The central section 20 has an average tensile strain of about 5.2%. The lateral half-reflectors 41 are here Bragg mirrors each formed of a plurality of periodic local structures produced in the tensioning arms 30. The Bragg mirrors are here placed at a distance of about 15 μm from the corresponding end P of the central section 20, measured along the main axis $A_p$, for various values of the main separating angle $\theta_p$. For the angle $\theta_p = 0°$, each optical reflector 40 includes only a single Bragg mirror located on the longitudinal axis Δ (as illustrated in FIG. 1B and 1C), and for the angles $\theta_p > 0°$, each optical reflector 40 includes two lateral Bragg half-mirrors 41 (as illustrated in FIGS. 2A and 2B).

The inventors have observed that dividing each optical reflector 40 into two lateral half-reflectors 41 that are separate from each other and positioned on either side of the longitudinal axis Δ decreases the value of the strain differential $\Delta\varepsilon_c$ at the centre of the central section. Thus, it would appear that the differential $\Delta\varepsilon_c$ decreases as the main separating angle $\theta_p$ increases: it thus passes from a maximum value of about −0.3% for $\theta_p = 0°$ (see FIG. 1B and 1C) to about −0.15% for $\theta_p = $ about 25°, to a value of almost zero, i.e. of about −0.025%, for an angle $\theta_p$ of about 55°. Thus, the fact of producing each optical reflector 40 in the form of two lateral half-reflectors 41 positioned on either side of the longitudinal axis Δ allows the decrease in the strain experienced by the central section 20 to be limited. The electronic and/or optical properties of the suspended membrane, and in particular of the central section 20, are thus preserved.

FIG. 2C also illustrates the influence of the main separating angle $\theta_p$ on the maximum local strain value $(\varepsilon_{xy})_{max}$ experienced by each tensioning arm 30 in the presence of the optical cavity, and on the maximum strain amplitude $\Delta\varepsilon_{max}$ experienced by each tensioning arm 30 in the presence of the optical cavity. The maximum amplitude $\Delta\varepsilon_{max}$ is here defined as being the difference between the maximum strain value $(\varepsilon_{xy})_{max}$ and the minimum strain value $(\varepsilon_{xy})_{min}$ experienced by the tensioning arms 30 in the presence of the optical cavity.

The inventors have thus observed that, from a threshold value of the main separating angle $\theta_p$, here from 25°, the tensioning arms 30 have a maximum local value $(\varepsilon_{xy})_{max}$ and a maximum amplitude $\Delta\varepsilon_{max}$ that decreases as the main separating angle $\theta_p$ of the lateral half-reflectors 41 increases. This is a result of the fact that the tensioning arms 30 experience fewer mechanical stresses, and that the zones of concentration of the mechanical stresses have a lower local intensity, thus improving the mechanical strength of the tensioning arms 30 and therefore of the suspended membrane, this contributing to preserving the electronic and/or optical properties of the latter.

FIG. 3 illustrates the influence of the local width w of the central section 20 at its ends P, i.e. at the junction 31 with the tensioning arms 30, on the median angle $\theta_{p,diff}$ and on the minimum angle $\theta_{m,diff}$ made by the scattering of the uneven mode TE01 in the direction of the lateral half-reflectors 41.

In this example, the suspended membrane is made of germanium, and includes a central section 20 of about 600 nm thickness and average width, and of about 15 µm length. The tensioning arms 30 have a rectangular shape of about 55 µm width for a thickness of about 600 nm. The central section 20 has an average tensile strain of the order of about 5.2%. An optical signal propagates in the optical cavity, at a wavelength of 2.5 µm. The central section 20 has, at its ends P located at the junction 31 with the tensioning arms 30, a local width w larger than the average width a. The central section 20 supports, and transmits in the direction of the lateral half-reflectors 41, at least the uneven mode TE01.

As mentioned above, the median angle $\theta_{p,diff}$ corresponds to the intensity peak of the optical mode in its scattering cone. Moreover, the minimum scattering angle $\theta_{m,diff}$ corresponds to the maximum value of the light intensity divided by $e^2$ (Gaussian distribution). The uneven-order mode thus has an angular intensity profile that follows a Gaussian distribution with a radius of $1/e^2$. It would appear that the uneven mode TE01 scatters in the direction of the lateral half-reflectors 41 with a median angle $\theta_{p,diff}$ that increases with the value of the local width w. In this example, the uneven mode TE01 has an angular intensity profile with a $1/e^2$ angle of about 20°. Specifically, the differential scattering cone of the uneven mode TE01 is oriented at the median angle $\theta_{p,diff}$, which here increases from about 34° to 47° for a local width w of the central section 20 of 700 nm to 1.2 µm. The minimum angle $\theta_{m,diff}$ here increases from 14° to 26°.

It would moreover appear that, from about 0.8 µm, increasing the local width w of the central section 20 at its ends P no longer induces an increase in the median scattering angle $\theta_{p,diff}$ of the uneven mode TE01. Thus, it is advantageous to position the lateral half-reflectors 41 at a main scattering angle $\theta_p$ larger than or equal to 40°, and for example equal to about 40°, and to locally dimension the central section 20 so as to form a local width w at its ends P of at least about 0.8 µm. Thus, because of the large separation of the lateral half-reflectors 41 on either side of the longitudinal axis Δ, the intensity of the zones of concentration of stress in the tensioning arms 30 is minimized and the strain experienced by the central portion 20 is decreased, while optimizing the quality factor of the optical cavity associated with the uneven mode, here the TE01 mode.

FIGS. 4A and 4B are schematic and partial top views of two different examples of a semiconductor structure 1 according to the first embodiment, in which embodiment the central section 20 is multimode over its entire length and is designed to support the fundamental mode and at least one higher-order uneven mode. In these examples, the central section 20 is designed to support the fundamental mode TE00 and at most the uneven mode TE0 1. It may nevertheless be designed to also, or as a variant, support transverse magnetic modes, namely the fundamental mode TM00 and the uneven mode TM01.

With reference to FIG. 4A, the central section 20 has a rectangular shape that is suspended and tensilely stressed uniaxially along the longitudinal axis Δ by two tensioning arms 30 that are opposite each other. The central section 20 thus has transverse dimensions, thicknesswise along the Z-axis and widthwise along the Y-axis, suitable for supporting the TE00 and TE01 modes over its entire length. Its transverse dimensions are furthermore chosen so that they do not support modes of order higher than the first order, such as the modes TE02 and TE03. The central section 20 is dimensioned using techniques known to those skilled in the art, depending on the desired number and type of optical modes and the reference wavelength $\lambda_0$ of the light signal intended to be emitted by the laser source, which depend on the desired photonic application.

The optical cavity is defined by two optical reflectors 40, each being formed of two lateral half-reflectors 41 that are arranged on either side of the longitudinal axis Δ so as to reflect the uneven mode TE01. The lateral half-reflectors 41 correspond to Bragg mirrors, but as a variant may be cube-corner structures such as those mentioned above. They are therefore placed at a main separating angle $\theta_p$ substantially equal to the median scattering angle $\theta_{p,diff}$ of the uneven mode TE01. The fundamental mode TE00 is scattered substantially isotropically, so that it is partially reflected by the lateral half-reflectors 41. The two modes TE00 and TE01 thus share the gain, but the uneven mode TE01 is reflected more by the lateral half-reflectors than the fundamental mode TE00, so that, within the optical cavity, the uneven mode TE01 is favoured over the TE00 mode sufficiently to provoke the emission of the laser source.

With reference to FIG. 4B, the central section 20 has a substantially circular shape that is suspended and tensilely stressed biaxially along two longitudinal axes $\Delta_1$ and $\Delta_2$ by two pairs of tensioning arms 30 that are opposite pairwise. The tensioning arms 30 here have a trapezium shape the width of which increases with distance from the central section 20. The central section 20 has an area that is here bounded by a circle passing through the junctions 32 between the adjacent tensioning arms 30. The ends P of the central section 20 may here be located at the intersection between the dashed circle in FIG. 4B and the longitudinal axes $\Delta_1$ and $\Delta_2$. The width of the central section 20, which is here oriented along the Y-axis orthogonal to the longitudinal axis $\Delta_2$, makes the waveguide that forms the central section 20 multimode. In so far as the width along the Y-axis is larger than the thickness of the central section 20, it supports transverse electric (TE) modes. It therefore supports the fundamental mode TE00 and at least the uneven mode TE01, and preferably at most the uneven mode TE01.

The optical cavity is bounded by two optical reflectors 40 each formed of two lateral half-reflectors 41 that are arranged in the tensioning arms 30 that extend along the longitudinal axis $\Delta_2$. The tensioning arms 30 that are arranged along the longitudinal axis $\Delta_1$ do not here include optical reflectors 40, but could however. The two lateral half-reflectors 41 of a given tensioning arm 30 are arranged on either side of the longitudinal axis $\Delta_2$ in order to allow the uneven mode TE01 to be reflected. The lateral half-reflectors 41 are here also Bragg mirrors, but could be cube-corner structures. They are therefore placed at a main separating angle $\theta_p$ substantially equal to the median scattering angle $\theta_{p,diff}$ of the uneven mode TE01.

Such a semiconductor structure 1 may participate in the formation of an electron-pumped laser source, the charge carriers thus being injectable into the central section 20 via the tensioning arms 30 that are oriented along the longitudinal axis $\Delta_1$ that does not include optical reflectors 40.

These tensioning arms 30 may thus be doped, one n-type and the other p-type, and the central section 20 may be intrinsic (unintentionally doped).

FIGS. 5A and 5B illustrate a semiconductor structure 1 according to a second embodiment, in which embodiment the central section 20 is structured to have a monomode main portion 21 and two mode-converting portions 22, the latter being located between the monomode portion 21 and the tensioning arms 30. FIG. 5A is a schematic and partial top view of the suspended membrane, and FIG. 5B is a detailed view of a portion of the suspended membrane illustrated in FIG. 5A.

Thus, the monomode portion 21 of the central section 20 is designed to solely support the fundamental mode, for example here the TE00 mode. To this end, the monomode portion 20 has transverse dimensions, thicknesswise along the Z-axis and widthwise along the Y-axis, such that only the fundamental mode is supported. By way of example, for a wavelength of the optical signal of 2.5 µm, the monomode portion 21 may have a thickness and a width of about a few hundred nanometres, 600 nm for example.

The mode converters 22 are designed to convert, preferably adiabatically, the optical power carried by the fundamental mode guided in the monomode portion 21 into an uneven-order mode, preferably the TE01 mode. To this end, the central section 20 has, over a length defining the mode-converting portions 22, dimensions that are adjusted locally, thicknesswise and/or widthwise, here widthwise as the supported modes are transverse electric modes. The transverse dimensions and conversion length may be chosen so as to maximize the coefficient of conversion between the modes, in particular using a software package for numerically simulating the equations of electromagnetism in the finite difference time domain. An example of a mode converter is in particular described in the document by Chen et al. entitled *Low-loss and fabrication tolerant silicon mode-order converters based on novel compact tapers*, Opt. Express 23 (9), 11152-11159. Each mode converter 22 thus forms an intermediate portion located between the monomode portion 21 of the central section 20, for example of width and of thickness of about 600 nm, and, here, an end multimode portion 23 that is designed to support the TE01 mode, for example of width of about 1 µm and of thickness of about 600 nm. The intermediate mode-converting portion 22 has, in this example, a plurality of sections of different lengths and widths, that are designed, by numerical simulation, to optimize conversion efficiency. The multimode portions 23 here form the junction 31 with the tensioning arms 30. They remain optional and may be omitted to obtain a monomode portion 21 of large length, thus allowing the gain of the laser source to be optimized. Moreover, the intermediate portion 22 may have a continuous or discontinuous variation in its transverse dimensions.

It would moreover appear that the presence of the mode-converting portions 22 does not substantially modify the maximum value of the tensile mechanical stresses experienced at the centre of the central section 20, and has very little influence on the average value of the mechanical stresses within the central section 20. A semiconductor structure 1 according to this embodiment is thus advantageous in so far as a single optical mode, here the fundamental mode TE00, is present at the centre of the central section 20, i.e. in the monomode portion 21, and is almost entirely converted into the uneven-order mode, here the TE01 mode. Thus the quality factor of the optical cavity is increased and sharing of the gain of the laser source in the central section 20 between on the one hand the fundamental mode and on the other hand the uneven-order mode is avoided.

Particular embodiments have just been described. Various variants and modifications will seem obvious to those skilled in the art. Thus, in the examples of semiconductor structures according to the various embodiments described above, the central section 20 could be designed to support at least one transverse electric (TE) mode, or even at least one transverse magnetic (TM) mode. In this case, the central section 20 would have a thickness along the Z-axis chosen so as to allow it to support at least one TM mode. The uneven mode TM01 diverges in two symmetric lobes, similarly to what was described above with reference to the TE01 mode. The central section 20 may be designed to support both at least one TE mode and at least one TM mode.

The invention claimed is:

1. Semiconductor structure, including:
   a semiconductor layer made of a crystalline semiconductor compound, including a membrane suspended above a carrier layer, the suspended membrane being formed:
   of a central section, which is tensilely stressed in a plane parallel to the carrier layer, and which forms a waveguide able to support at least one optical mode; and
   of a plurality of lateral sections, which are opposite one another with respect to the central section, and which are arranged so as to keep the central section suspended and tensilely stressed, the lateral sections having an average width larger than an average width of the central section; and
   at least one optical cavity, bounded by:
   two optical reflectors, which are placed in the lateral sections on either side of the central section;
   wherein:
   the central section is designed to transmit in the direction of the optical reflectors at least one uneven-order mode; and
   each of said optical reflectors is formed of two lateral half-reflectors, which are separate from one another and arranged on either side of a longitudinal axis of the lateral section in which they are placed, so as to at least partially reflect said uneven-order mode.

2. Semiconductor structure according to claim 1, wherein the lateral half-reflectors each have a main separating angle defined between, on the one hand, a median axis passing through a centre of the lateral half-reflector and through an end of the central section located facing the corresponding lateral half-reflector and, on the other hand, the longitudinal axis of the lateral section.

3. Semiconductor structure according to claim 2, wherein the main separating angle is larger than 25°.

4. Semiconductor structure according to claim 2, wherein the central section has a local width, at its ends, larger than an average width of the central section, and designed so that the uneven-order mode has a median scattering angle in the direction of the lateral half-reflectors substantially equal to the main separating angle.

5. Semiconductor structure according to claim 2, wherein the central section has a local width, at its ends, larger than or equal to 0.8 µm, and wherein the lateral half-reflectors each have a main separating angle larger than or equal to 40°.

6. Semiconductor structure according to claim 1, wherein the uneven-order mode is the first-order mode.

7. Semiconductor structure according to claim 1, wherein the central section is designed to transmit, in the direction of the optical reflectors, at most the fundamental mode and the first-order mode.

8. Semiconductor structure according to claim 7, wherein the central section is multimode over its entire length and has at least one transverse dimension such that it permits the transmission of the fundamental mode and at most the first-order mode.

9. Semiconductor structure according to claim 1, wherein the central section includes a monomode portion designed to support the fundamental mode and, placed between the lateral sections and the monomode portion, mode converters that are designed to convert the fundamental mode into the uneven-order mode.

10. Semiconductor structure according to claim 1, wherein the crystalline semiconductor compound is a germanium-based compound.

11. Semiconductor structure according to claim 1, wherein the central section has an average tensile strain such that its energy band structure is direct.

12. Laser source including a semiconductor structure according to claim 1, wherein the central section forms the gain medium of the laser source.

* * * * *